US006980132B2

(12) United States Patent
Soar et al.

(10) Patent No.: US 6,980,132 B2
(45) Date of Patent: *Dec. 27, 2005

(54) FLOATING APERTURE ENCODER

(75) Inventors: Steven E. Soar, Vancouver, WA (US); Michael A. Viselli, Camas, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 233 days.

This patent is subject to a terminal disclaimer.

(21) Appl. No.: 10/661,030

(22) Filed: Sep. 11, 2003

(65) Prior Publication Data
US 2004/0056780 A1    Mar. 25, 2004

Related U.S. Application Data

(63) Continuation of application No. 10/164,836, filed on Jun. 7, 2002, now Pat. No. 6,646,571.

(51) Int. Cl.[7] ............................................... H03M 1/22
(52) U.S. Cl. ........................................ 341/14; 341/15
(58) Field of Search ..................................... 341/13, 15

(56) References Cited

U.S. PATENT DOCUMENTS

| 4,375,592 A | 3/1983 | Cox et al. |
| 6,646,571 B1 * | 11/2003 | Soar et al. ..................... 341/13 |

FOREIGN PATENT DOCUMENTS

JP          570207819         12/1982

* cited by examiner

Primary Examiner—Peguy JeanPierre
Assistant Examiner—Joseph Lauture

(57) ABSTRACT

An encoder includes a housing, a light source coupled to the housing, and a light sensor coupled to the housing and positioned to receive a light beam from the light source. The encoder also includes a wheel having opaque and transmissive sections which may be positioned to pass through the light beam before it reaches the light sensor. The encoder further includes a floating aperture piece, which defines at least one aperture. The aperture is positioned so that the light beam must pass through it before reaching the light sensor. The floating aperture piece slidably engages the housing while allowing a loose tolerance between a position of the wheel and a position of the housing, thereby substantially eliminating a positioning error between the aperture and the wheel.

16 Claims, 4 Drawing Sheets

FLOATING APERTURE ENCODER

This is a continuation of application Ser. No. 10/164,836, filed Jun. 7, 2002, now U.S. Pat. No. 6,646,571.

INTRODUCTION

Imaging mechanisms often include a media positioning mechanism to move an image media through an imaging zone. Often, the media positioning mechanisms include rollers which contact the image media, hold it against some form of backing device, and advance the image media as needed through the imaging zone. As the image media is advanced, the imaging mechanism may form an image, as desired, on the image media, using one or more of a variety of imaging techniques. Examples of imaging techniques include, thermal inkjet, piezoelectric inkjet, liquid and dry electrophotography, dye sublimation, and lithography.

Regardless of the imaging technique used, higher and higher image resolutions are often desired. Many factors contribute to the ability of an imaging mechanism to form high resolution images. Control over the size of the colorants as they are placed onto the image media is important. Also important is the ability of the media positioning mechanism to accurately advance the image media through the imaging zone, where it will receive colorants, in such a manner that the media advances are commensurate with the desired resolution. For example, if a resolution of $\frac{1}{1200}$ of an inch is desired in the direction of the media advance, then it may be desirable to move the media at a maximum of $\frac{1}{1200}$ of an inch when imaging at that resolution.

In order to reliably rotate a media positioning roller such a small distance, the roller is often coupled to an encoder wheel. The encoder wheel has gaps or transmissive areas on its circumference which allow light to pass, and opaque or blocking portions which do not allow light to pass. The encoder wheel typically passes through a device which has a light source and a light sensor. The light source is positioned on one side of the encoder wheel, and the light sensor may be positioned opposite the light source on the other side of the encoder wheel. As the roller coupled to the encoder wheel rotates, the encoder wheel also rotates. This causes portions of the encoder wheel to alternately allow light to pass, and not to pass to the light sensor. The light sensor can thus form an electrical waveform which has a shape relating to the spacing of the gaps in the encoder wheel which allow the light to pass.

By making the gaps, and the blocking portions of the encoder wheel small enough, the shape of the encoder waveform can correspond to a desired resolution in terms of image media movement. For example, if the encoder wheel has gaps at 100 per inch movement at the media positioning roller, each duty cycle in the waveform from the encoder light sensor could correspond to a $\frac{1}{100}$ of an inch movement of an image media being advanced by the media positioning mechanism. An analog-to-digital (A/D) converter may be coupled to the waveform from the encoder light sensor, and the digitized signal can be analyzed by a microprocessor, application specific integrated circuit (ASIC), or other processing means. By looking at the linear portions of the encoder waveform between duty cycles, positional moves smaller than the spacing of the encoder wheel gaps may be monitored and made. The processing means may be configured to convert the encoder waveform to positional data, and given system parameters such as the inertia of the positioning mechanism roller and the thickness of the image media, the processing means may control a motor or clutch that drives the roller to achieve a desired media advance.

In order for the microprocessor to properly control the media positioning mechanism, it is important to have a strong waveform from the encoder.

DETAILED DESCRIPTION OF THE PREFERRED EMBODIMENTS

Figure 1:
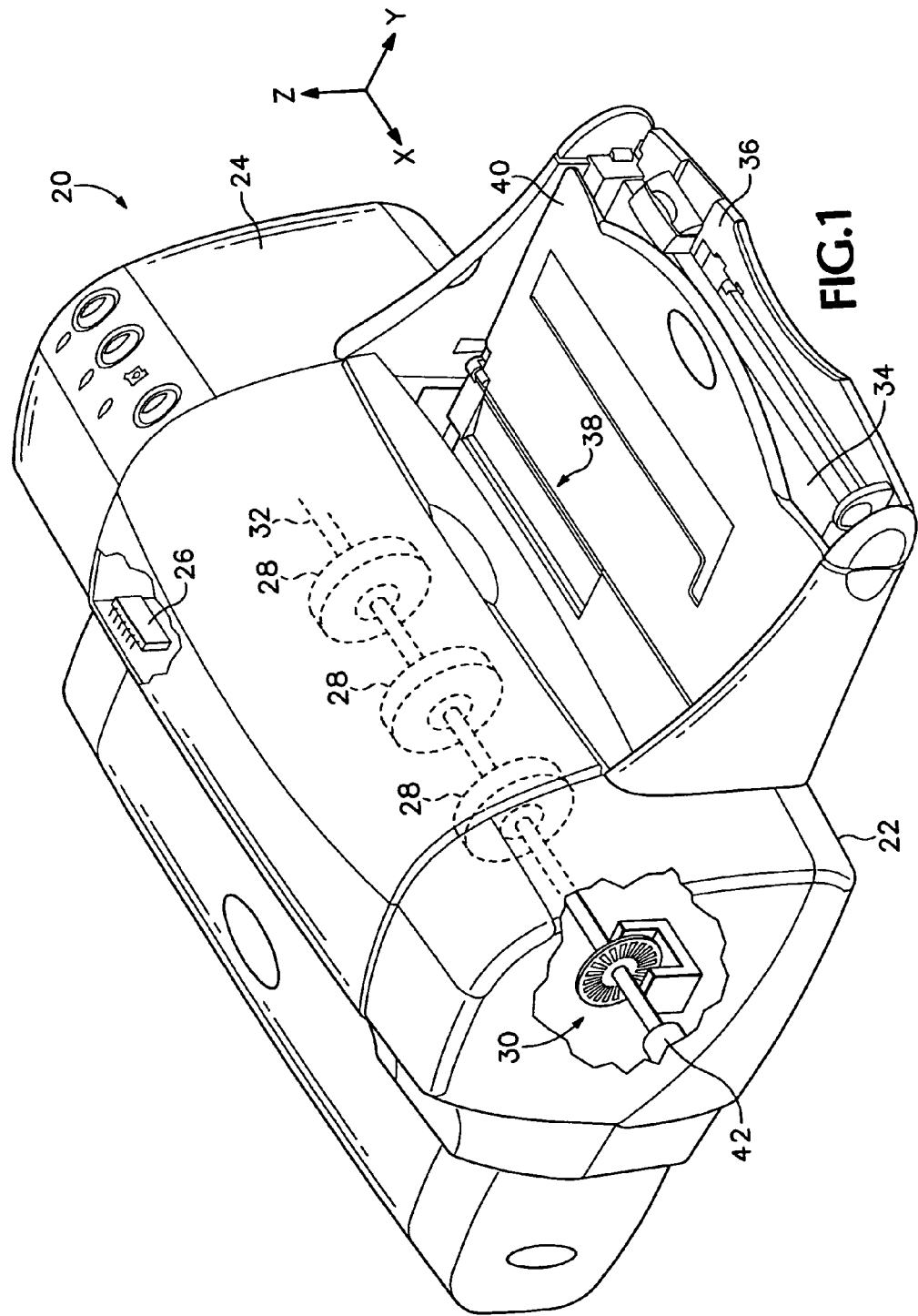
FIG. 1 is a fragmented perspective view of one form of an inkjet printing mechanism, here illustrating one embodiment of an encoder.

FIG. 1 illustrates an embodiment of an imaging mechanism, here shown as an inkjet printer 20, constructed in accordance with the present invention, which may be used for printing on a variety of media, such as paper, transparencies, coated media, cardstock, photo quality papers, and envelopes in an industrial, office, home or other environment. A variety of imaging mechanisms are commercially available. For instance, some of the imaging mechanisms that may embody the concepts described herein include desk top printers, portable printing units, wide-format printers, hybrid electrophotographic-inkjet printers, copiers, cameras, video printers, and facsimile machines, to name a few. For convenience the concepts introduced herein are described in the environment of an inkjet printer 20.

While it is apparent that the printer components may vary from model to model, the typical inkjet printer 20 includes a chassis 22 surrounded by a frame or casing enclosure 24, typically of a plastic material. The printer 20 also has a printer controller, illustrated schematically as a microprocessor 26, that receives instructions from a host device, such as a computer or personal data assistant (PDA) (not shown). A screen coupled to the host device may also be used to display visual information to an operator, such as the printer status or a particular program being run on the host device. Printer host devices, such as computers and PDA's, their input devices, such as a keyboards, mouse devices, stylus devices, and output devices such as liquid crystal display screens and monitors are all well known to those skilled in the art.

The printer 20 has a set of media rollers 28 which are coupled to an encoder 30 by shaft 32. The media rollers 28 work in conjunction with a media positioning system (not shown) that transports an imaging media 34 from a media input tray 36, through a printzone 38 where the media may receive colorants, and to an output tray 40. As illustrated, the shaft 32 coupled to the media rollers 28 is driven by a motor 42. The shaft 32 and media rollers 28 may be driven by any suitable means, however, including a clutch, gears, pulleys, belts, chains, friction rollers, or any combination thereof. Additionally, the encoder 30 need not be directly mounted on the shaft 32, but could be located on a separate but coupled shaft, even rotating at a different rate from the shaft 32 due to gearing or drive train ratios. As the imaging media 34 passes through the printzone 38, it may be advanced by the media rollers 28 which contact the imaging media 34.

Figure 2:
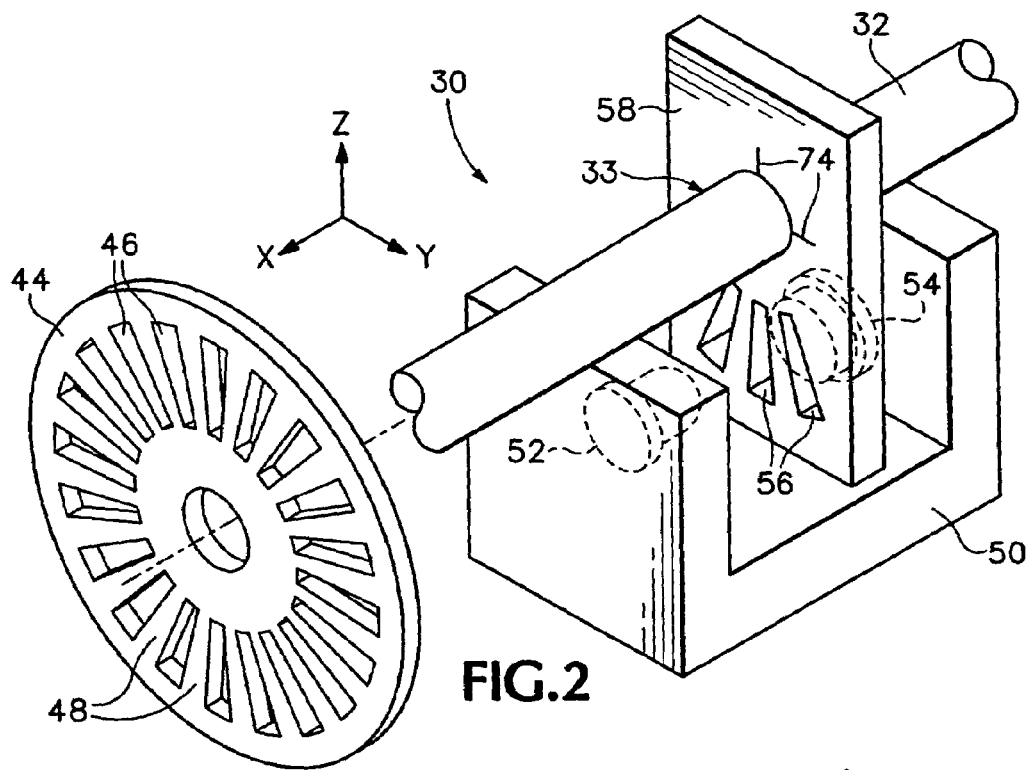
FIG. 2 is an enlarged, partially exploded perspective view of one embodiment of an encoder.

FIG. 2 illustrates an embodiment of encoder 30 in a magnified and partially exploded view. The encoder 30 has an encoder wheel 44 which is coupled to the shaft 32 at location 33 with the assistance of positioning hardware (not shown), such as with a pressed-fit collar located at the center of the wheel 44. Other means of mounting the encoder wheel 44 to the shaft 32 will be apparent to those skilled in the art. The encoder wheel 44 has gaps 46 around its circumference which allow light to pass through the encoder wheel. The encoder wheel 44 also has light blocking portions 48 between the gaps 46. The encoder wheel 44 passes through an encoder housing 50. Coupled to the encoder housing 50 is a light source 52, such as light emitting diode (LED). A light sensor 54 is also coupled to the encoder housing 50. The light source 52 is positioned on one side of the encoder wheel 44, and the light sensor 54 may be positioned on the other side of the wheel 44 so that light emitted from the light source 52 will pass through encoder wheel gaps 46 and contact the light sensor 54.

The gaps 46 and the light blocking portions 48 are illustrated at a relatively large size for the sake of clarity of explanation and the ease of illustration. It should be understood, however, that very fine gaps 46 and light blocking portions 48 may be formed on an encoder wheel 44, for example on the order of 200 gaps per inch as measured around the circumference. The encoder wheel may be formed of a material such as ABS plastic with gaps 46 molded or routed away, or may be formed on a clear disk where the opaque or light blocking portions 48 are formed from printed lines or photographic processes, which then define the transmissive gaps 46 therebetween.

When a gap 46 or gaps 46 allow a light beam from the light source 52 to pass through the encoder wheel 44 and onto the light sensor 54, the incident light causes light sensor 54 to produce a current or a voltage proportional to the amount of incident light. The light sensor 54 is coupled to the microprocessor 26, and the current or voltage from the light sensor 54 creates a waveform over time which the microprocessor 26 can analyze. An analog-to-digital (A/D) converter may be coupled to the waveform from the encoder light sensor 54, and the digitized signal can also be analyzed by a microprocessor, application specific integrated circuit (ASIC), or other processing means. The microprocessor 26 may be configured to convert the encoder waveform to positional data, and given system parameters such as the inertia of the positioning mechanism roller and the mass of the image media, the microprocessor 26 may control the motor 42 that drives the media rollers 28 to achieve a desired media advance.

Figure 3:
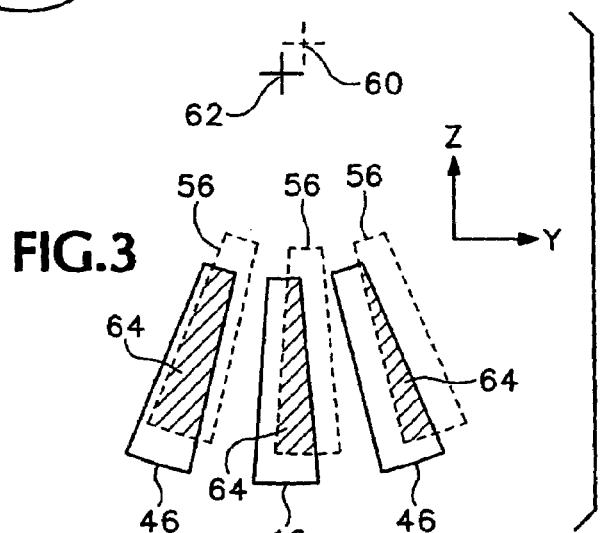
FIG. 3 is a schematic illustration of one possible mismatch between the centers of one embodiment of an encoder wheel and one embodiment of an aperture.
Figure 4:
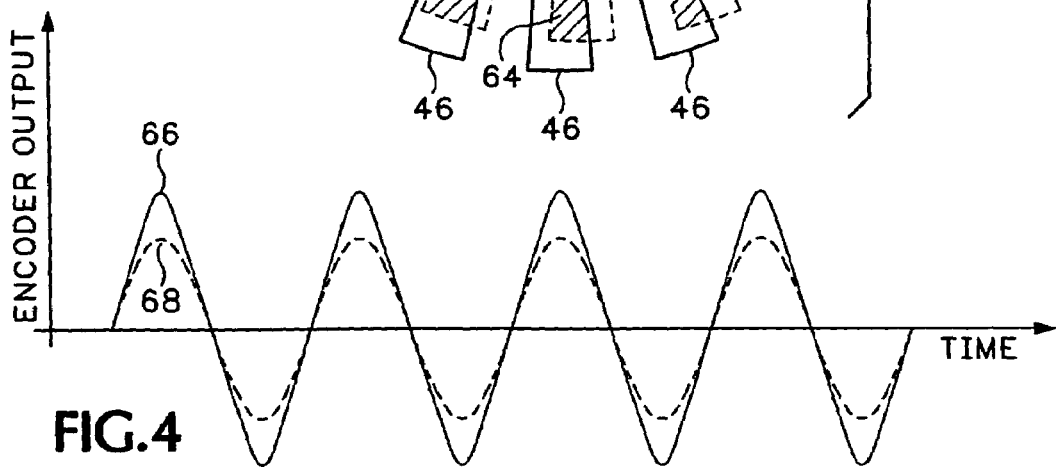
FIG. 4 illustrates possible encoder waveforms.

An aperture 56, may be placed in-front of the light sensor 54 to limit the areas of the light sensor 54 which can actually receive light. Thus, only the gaps 46 which align with the apertures 56 will allow light to pass on to the sensor 54, preventing the light sensor 54 from saturating and allowing the light sensor 54 to produce a signal which corresponds to the angular displacement of the shaft 32. The aperture 56 may be defined by a floating aperture piece 58. The floating aperture piece 58 may be slidably engaged with the encoder housing 50. If, instead, the aperture piece was attached to the encoder housing 50, there would be a great need for alignment between the center of the apertures 56 and the center of the encoder wheel 44. FIGS. 3 and 4 illustrate the need for careful alignment when an aperture piece is fixed to the encoder housing 50, rather than floating like the floating aperture piece 58 of FIG. 2.

FIG. 3 illustrates apertures 56 centered on aperture center 60. A section of encoder gaps 46, centered on encoder wheel center 62 are also shown. As illustrated, the aperture center 60 and the encoder wheel center 62 are offset from each other in both the Z-axis direction and the Y-axis direction. Since light may only pass through the overlap areas 64 between the gaps 46 and the aperture 56, a smaller amount of light passes through to the light sensor 54 when the aperture center 60 and the encoder wheel center 62 are offset in the Z-axis direction, the Y-axis direction, or both. Any misalignment between the aperture center 60 and the encoder wheel center 62 is referred to as tangential positioning error (in the Y-axis direction) or radial positioning error (in the Z-axis direction). For simplicity, the tangential positioning error and/or radial positioning error will be referred to as a positioning error.

FIG. 4 illustrates two potential waveforms from an encoder light sensor 54. The solid line waveform 66 corresponds to the voltage or current output of the encoder light sensor 54 when there is little, or substantially little positioning error. An A/D converter coupled to the microprocessor 26 should be designed to utilize its full resolution over this waveform 66. When there is positioning error, however, the smaller overlap areas 64 shown in FIG. 3 may result in a waveform, like the dashed-line waveform 68 of FIG. 4. As can be seen, positioning error causes a loss of amplitude and linearity. In fact, a positioning error of only 0.5 millimeters in the Y-axis direction degrades the amplitude by as much as thirty-two percent on one model of inkjet printer 20. A smaller amplitude and less linear signal means the full A/D converter range is not being utilized, and movement errors may occur with the image media 34 as it is moved through the imaging zone 38. These movement errors can result in image quality defects.

The encoder 30, with a floating aperture piece 58, embodied in FIG. 2 reduces or eliminates the positioning error. The floating aperture piece 58 is mounted on the same shaft 32 as the encoder wheel 44. Thus, the apertures 56 and the encoder gaps 46 closely share centers 60, 62. As pointed out earlier, an aperture location determined by the encoder housing 50 can be subject to an increased positioning error due to a large tolerance stack. The shaft 32 is typically supported by a bearing or bushing (not shown) and a bracket (not shown) which are mounted to the chassis 22. A possible tolerance stack between the encoder wheel center 62 and the aperture center 60 involves the tolerances from the shaft 32 to bearing or bushing, the bearing or bushing to bracket, the bracket to chassis 22, the chassis 22 to encoder housing 50, and the encoder housing 50 to an aperture piece. There may be other elements in this tolerance stack if other brackets are used, for example to position the encoder housing relative to the chassis, but the point is that the tolerance stack may be significant from the encoder shaft 32 to the encoder housing 50 with respect to the positioning error between the aperture center 60 and the encoder wheel center 62. Therefore, a floating aperture piece 58, which is able to float within the encoder housing 50 but also locates to the same shaft 32 that the encoder wheel 44 is mounted on, such as the embodied encoder 30 in FIG. 2, allows a loose tolerance for mounting the housing and may have a greatly reduced positioning error.

Figure 5:
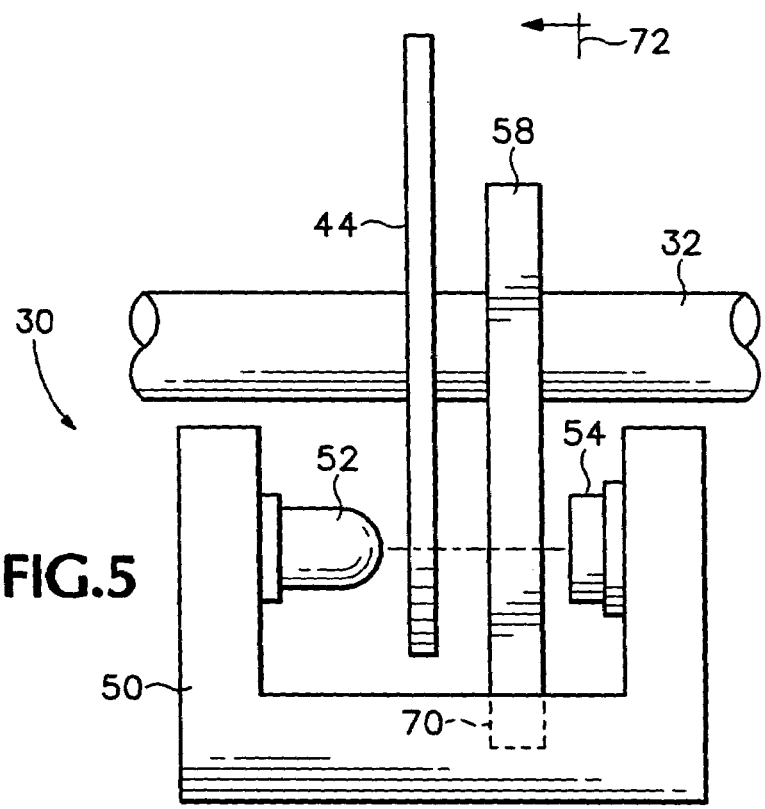
FIG. 5 is an enlarged, front elevational view of the embodied encoder of FIG. 2.
Figure 6:
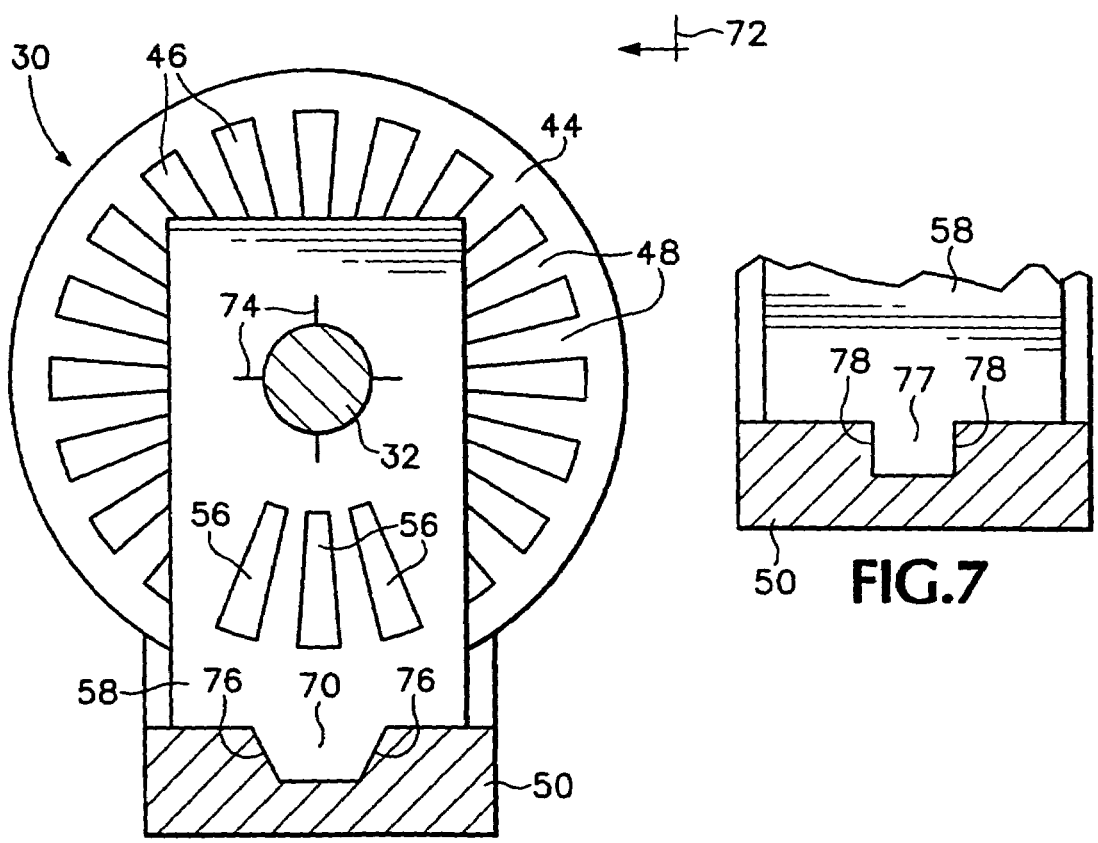
FIG. 6 is an enlarged cross-sectional side elevation view illustrating the embodied encoder of FIG. 2.
Figure 7:
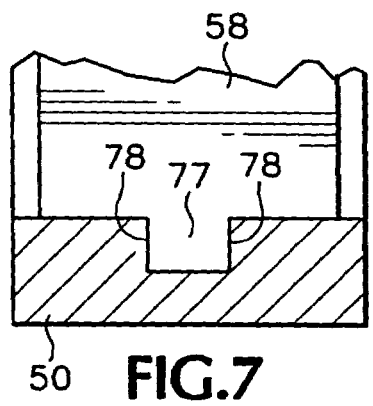
FIG. 7 is an enlarged cross-sectional side elevation view of a portion of another embodiment of an encoder.

FIG. 5 illustrates the embodied encoder 30 of FIG. 2 in a front view. The floating aperture piece 58 is located on the shaft 32, and also has a key 70 which floats in the encoder housing 50. FIG. 6 is a cross-sectional side view of the encoder 30, with the cross-section taken along cross-section line 72 shown in FIG. 5. The floating aperture piece 58 has orthogonal slitting 74 to allow the floating aperture piece to snap and self-center around the shaft 32. The floating aperture piece 58 could be constructed without orthogonal slitting 74 and sized to slide over shaft 32. FIG. 6 shows one embodiment of the floating aperture piece key 70. The key 70 has angled edges 76 which slidably engage a space defined by the encoder housing 50. FIG. 7 is a fragmented, cross-sectional view of an alternate embodiment of a floating aperture piece key 77 which has edges 78 substantially parallel to lines tangential from the shaft 32. The keys 70, 77 embodied in FIGS. 6 and 7 allow the tolerance between the shaft 32 and the encoder housing 50 to vary or stay loose, while the keys 70, 77 can slide in the encoder housing 50.

Figure 8:
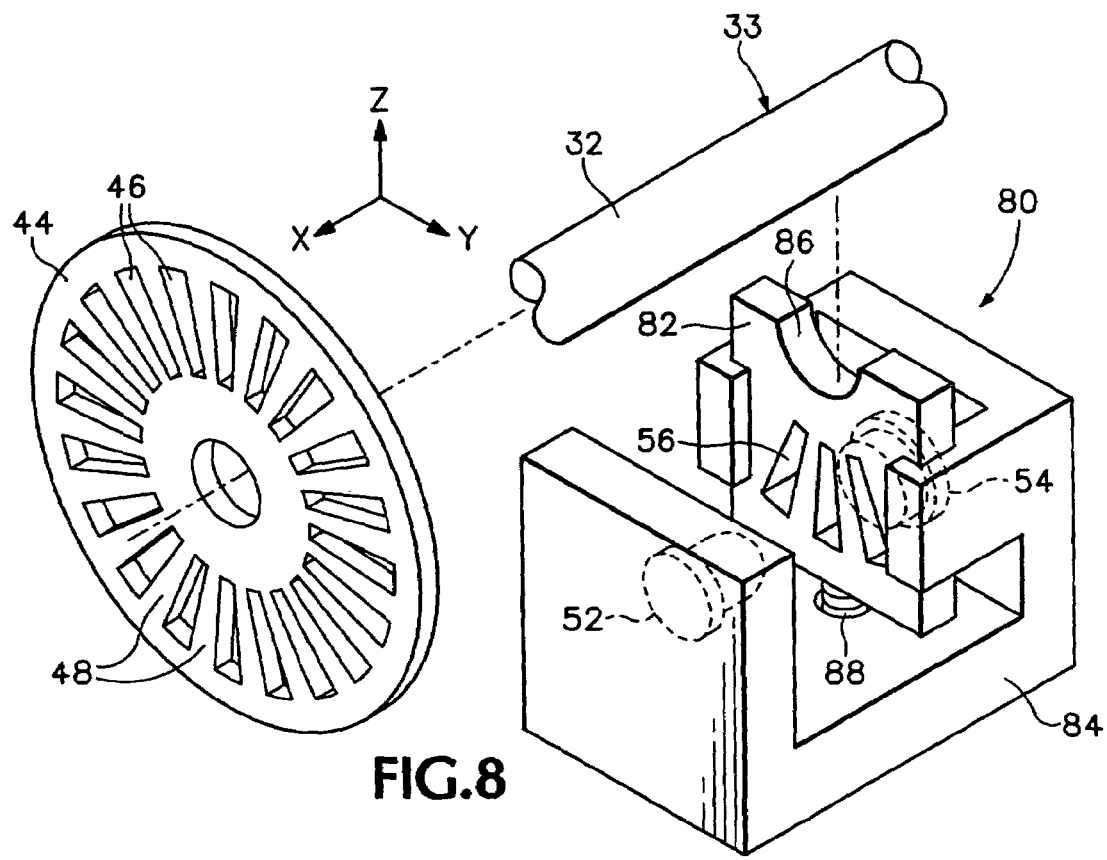
FIG. 8 is an enlarged partially exploded perspective view of another embodiment of an encoder.

FIG. 8 illustrates another embodiment of an encoder 80 which has a floating aperture piece 82 that locates to the shaft 32 to reduce or substantially eliminate the positioning error. The encoder 80 has an encoder wheel 44, with gaps 46 and light blocking portions 48 as described above with encoder 30. The encoder 80 also has a light source 52 and a light sensor as described above for encoder 30. Encoder 80 has an encoder housing 84 which acts as a guide to slidably engage the floating aperture piece 82, allowing the floating aperture piece 82 to slide up and down in the positive and negative Y-axis directions. The floating aperture piece 82 defines an arcuate shaft contact portion 86 which is mechanically biased against the shaft 32 by a spring member, here illustrated as coil spring 88. Alternately, the shaft contact portion 86 could have other shapes, such as a linear shape. Spring 88 is coupled between the encoder housing 84 and the floating aperture piece 82. Other biasing means, such as a leaf spring or a flexible protrusion integral with the housing 50, may be substituted by those skilled in the art, and this specification is intended to cover such functional and structural equivalents.

Figure 9:
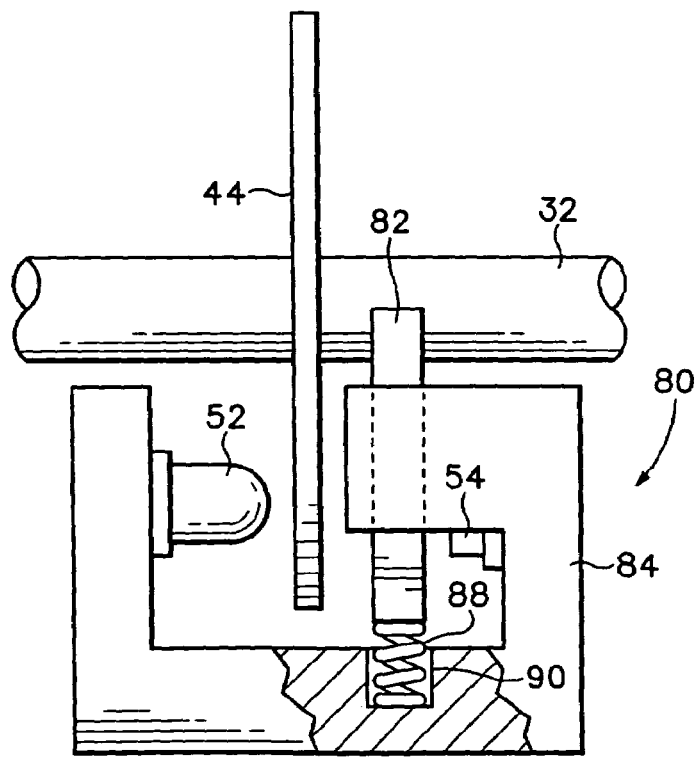
FIG. 9 is an enlarged partial cross-sectional side elevational view of the embodied encoder of FIG. 8.

FIG. 9 illustrates the embodied encoder 80 in a partial cross-section front view. The partial cross-section reveals how the spring 88 may be held in a cavity 90 defined by the encoder housing 84. FIG. 9 also illustrates the floating aperture piece 82 being biased against the shaft 32 which the encoder wheel 44 is also centered on. As with encoder 30 discussed previously, the light source 52 of encoder 80 emits light which may pass through encoder wheel 44 and onto the light sensor 54 when the gaps 46 in the encoder wheel 44 overlap with the apertures 56 in the floating aperture piece 82. Since the aperture piece 82 and the encoder wheel 44 share substantially the same centerline as determined by the shaft 32, the positioning error is eliminated or minimized, allowing a nearly maximum amplitude and encoder signal linearity.

Embodiments like those illustrated in FIGS. 2 and 8 allow the floating aperture piece 58, 82 to slide within the encoder housing 50, 84, thereby offering an advantage for manufacturability since the encoder housing 50,84 (including the light sensor 54 and the light source 52) does not have to be positioned precisely with respect to the shaft 32 on which the encoder wheel is mounted. Embodiments like the one illustrated in FIG. 8, with the notched floating aperture piece 82 have the additional advantage that the floating aperture piece 82 does not have to be passed over either end of the shaft 32, thereby allowing installation of the floating aperture piece 82 well after the shaft 32 has been installed.

By eliminating or nearly eliminating the positioning error, it may also be possible to use a smaller diameter encoder wheel 44. In order to have the same number of gaps 46 in a given arc on an encoder wheel of a smaller diameter, the gaps 46 must be more closely spaced than they would have to be on a larger diameter encoder wheel 44. Spacing the lines closer can result in signal problems when there is a large positioning error. However, with an encoder, such as encoder 30 or 80, which aligns the centerlines of the encoder wheel 44 and the apertures 56, to reduce or eliminate the positioning error, smaller encoder wheels 44 are possible since the encoder 30, 80 enables a strong and highly linear signal. A smaller diameter encoder wheel 44 will need more lines per inch to achieve the same duty cycle as a larger wheel 44, but the reduced positioning error made possible by embodiments like those in FIGS. 2 and 8 enable a more dense number of lines per inch. In discussing various components of the encoder 30, 80, various other benefits have been noted above.

Although embodiments of an encoder have been discussed within the environment of an imaging mechanism, in particular, an inkjet printing mechanism, it should be apparent that an encoder may be employed in a variety of other devices, including non-imaging devices, whenever positional, velocity, or acceleration feedback is required. It is apparent that a variety of other structurally and functionally equivalent modifications and substitutions may be made to construct an encoder according to the concepts covered herein depending upon the particular implementation, while still falling within the scope of the claims below.

We claim:

1. An encoder, comprising:
   a housing;
   a light source coupled to the housing;
   a light sensor coupled to the housing and positioned to receive a light beam from the light source;
   a wheel having opaque and transmissive sections which may be positioned to pass through the light beam before it reaches the light sensor; and
   a floating aperture piece, which defines at least one aperture, wherein:
   the aperture is positioned so that the light beam must pass through it before reaching the light sensor; and
   the floating aperture piece slidably engages the housing while allowing a loose tolerance between a position of the wheel and a position of the housing, thereby substantially eliminating a positioning error between the aperture and the wheel.

2. The encoder of claim 1, wherein the floating aperture piece further:
   defines an opening which may encircle a shaft on which the wheel may be mounted; and
   comprises a key which slidably engages the housing while allowing a loose tolerance between the position of the wheel and the position of the housing, thereby substantially eliminating a positioning error between the aperture and the wheel.

3. The encoder of claim 2, wherein the key has angled edges which do not lie in parallel planes.

4. The encoder of claim 2, wherein the key has straight edges which lie in substantially parallel planes.

5. The encoder of claim 2, wherein the floating aperture piece further defines orthogonal slits in conjunction with the defined opening in order to facilitate encircling the shaft.

6. The encoder of claim 1, further comprising a spring member, wherein:
- the floating aperture piece further comprises a notch sized to engage a shaft on which the wheel may be mounted; and
- the spring member is coupled between the housing and the floating aperture piece such that the spring member biases the floating aperture piece towards the shaft.

7. The encoder of claim 6, wherein the spring member is a coil spring.

8. The encoder of claim 6, wherein the spring member is a leaf spring.

9. The encoder of claim 6, wherein the spring member is a flexible protrusion integral with the housing.

10. The encoder of claim 6, wherein the notch has an arcuate portion.

11. The encoder of claim 6, wherein the notch has a linear portion.

12. A method of positioning an encoder housing relative to an encoder wheel mounted on a shaft in order to reduce or eliminate a positioning error, comprising:
- engaging the shaft adjacent to the encoder wheel with a floating aperture piece;
- slidably engaging the floating aperture piece with the encoder housing; and
- fixing the encoder housing in position without adjusting a location of the floating aperture piece.

13. The method of claim 12, wherein engaging the shaft adjacent to the encoder wheel with the floating aperture piece is performed without passing the floating aperture piece over either end of the shaft.

14. The method of claim 12, wherein engaging the shaft adjacent to the encoder wheel with the floating aperture piece comprises passing the floating aperture piece over either end of the shaft.

15. An imaging mechanism, comprising:
means for media positioning in an imaging zone; and
an encoder, comprising:
- a housing;
- a light source coupled to the housing;
- a light sensor coupled to the housing and positioned to receive a light beam from the light source;
- a wheel having opaque and transmissive sections which may be positioned to pass through the light beam before it reaches the light sensor; and
- a floating aperture piece, which defines at least one aperture, wherein:
  - the aperture is positioned so that the light beam must pass through it before reaching the light sensor; and
  - the floating aperture piece slidably engages the housing while allowing a loose tolerance between a position of the wheel and a position of the housing, thereby substantially eliminating a positioning error between the aperture and the wheel.

16. An encoder, comprising:
means for positioning an aperture piece relative to an encoder wheel so that a positioning error between the aperture and the encoder wheel is minimized; and
means for slidably positioning an encoder housing including a light source and a light sensor relative to the aperture piece.

* * * * *